(12) United States Patent
Kodavalla

(10) Patent No.: US 9,088,778 B2
(45) Date of Patent: Jul. 21, 2015

(54) METHOD AND SYSTEM FOR MULTIVIEW DISTRIBUTED VIDEO CODING WITH ADAPTIVE SYNDROME BIT RATE CONTROL

(75) Inventor: Vijay Kumar Kodavalla, Bangalore (IN)

(73) Assignee: Wipro Limited, Bangalore (IN)

( * ) Notice: Subject to any disclaimer, the term of this patent is extended or adjusted under 35 U.S.C. 154(b) by 509 days.

(21) Appl. No.: 13/593,566

(22) Filed: Aug. 24, 2012

(65) Prior Publication Data

US 2013/0258050 A1     Oct. 3, 2013

(30) Foreign Application Priority Data

Apr. 2, 2012   (IN) ........................ 1316/CHE/2012

(51) Int. Cl.
| | | |
|---|---|---|
| *H03M 13/00* | (2006.01) | |
| *H04N 13/00* | (2006.01) | |
| *H03M 13/29* | (2006.01) | |
| *H04N 19/597* | (2014.01) | |
| *H04N 19/30* | (2014.01) | |

(52) U.S. Cl.
CPC ....... *H04N 13/0048* (2013.01); *H03M 13/2909* (2013.01); *H03M 13/6312* (2013.01); *H04N 13/0059* (2013.01); *H04N 19/395* (2014.11); *H04N 19/597* (2014.11)

(58) Field of Classification Search
CPC ........... H04N 19/395; H03M 13/6312; H03M 13/2909
See application file for complete search history.

(56) References Cited

U.S. PATENT DOCUMENTS

| | | | | |
|---|---|---|---|---|
| 8,340,193 | B2* | 12/2012 | Lu et al. .................... | 375/240.19 |
| 8,810,633 | B2* | 8/2014 | Leung et al. .................... | 348/47 |
| 2003/0014718 | A1* | 1/2003 | De Souza et al. ............. | 714/804 |
| 2007/0217432 | A1* | 9/2007 | Molisch et al. ............... | 370/400 |
| 2010/0074331 | A1* | 3/2010 | Nishi ........................ | 375/240.12 |
| 2011/0128353 | A1* | 6/2011 | Leung et al. .................... | 348/47 |

* cited by examiner

*Primary Examiner* — M. Mujtaba K Chaudry
(74) *Attorney, Agent, or Firm* — LeClairRyan, a Professional Corporation

(57) ABSTRACT

A method and device for multiview distributed video coding with adaptive syndrome bit rate control are disclosed. In one embodiment, multiple groups, including video frames coming from associated digital cameras, are formed. Further, video frames coming from a predetermined number of the digital cameras are declared as key video frames. Furthermore, video frames coming from remaining digital cameras are declared as non-key video frames. In addition, the key video frames are encoded to obtain encoded bits. Moreover, the non-key video frames are encoded to obtain syndrome bits. Also, the encoded key video frames are decoded, to obtain decoded bits and the encoded non-key video frames are decoded, to obtain decoded bits and CRC bits. Further, an optimal number of syndrome bits in each non-key video frame are determined. Furthermore, the encoded bits and determined optimal number of syndrome bits are sent to multiple receivers.

28 Claims, 10 Drawing Sheets

| GROUP NUMBER | VIDEO FRAMES NUMBER | BIT-PLANE NUMBER | OPTIMAL NUMBER OF SYNDROME BITS |
|---|---|---|---|
| 1 | 2 | 1 | 1 |
| 1 | 2 | 2 | 1 |
| 1 | 2 | 3 | 1 |
| 1 | 2 | . | 1 |
| 1 | 2 | P | 1 |
| 1 | . | . | 1 |
| 1 | V-1 | 1 | 1 |
| 1 | . | . | 1 |
| 1 | V-1 | P | 1 |
| . | . | . | 1 |
| . | . | . | 1 |
| G | 2 | 1 | 1 |
| G | 2 | 2 | 1 |
| G | 2 | 3 | 1 |
| G | 2 | . | 1 |
| G | 2 | P | 1 |
| G | . | . | 1 |
| G | V-1 | 1 | 1 |
| G | . | . | 1 |
| G | V-1 | P | 1 |

METHOD AND SYSTEM FOR MULTIVIEW DISTRIBUTED VIDEO CODING WITH ADAPTIVE SYNDROME BIT RATE CONTROL

Benefit is claimed under 35 U.S.C 119(a)-(d) to Indian Application Serial Number 1316/CHE/2012 entitled "METHOD AND SYSTEM FOR MULTIVIEW DISTRIBUTED VIDEO CODING WITH ADAPTIVE SYNDROME BIT RATE CONTROL" filed on Apr. 2, 2012 by Wipro Limited.

TECHNICAL FIELD

Embodiments of the present subject matter relate to a multiview distributed video coding (MDVC). More particularly, embodiments of the present subject matter relate to a MDVC having adaptive syndrome bit rate control.

BACKGROUND

The advances in imaging and semiconductor technology coupled with high-speed wireless transmissions are enabling multiview acquisition using camera arrays. However, the biggest challenge with a multiview system (a system where multiple cameras monitor the same scene from different viewing positions) is handling huge amount of data obtained from the multiple cameras, compressing them, and either storing or transmitting, and yet being low cost by not demanding too much computing power, energy and memory requirements. One of the main challenges with existing multiview coding (MVC) standard is the requirement of inter-camera communications for exploiting inter-view redundancies. This significantly increases encoder complexity, encoding delay, memory requirements and power at the encoders. Further, MVC requires encoding all video frames and therefore, requires more bit-rates or transmission bandwidth and drastically increases encoding complexity.

The distributed video coding (DVC) which was originally intended for monoview applications has been extended to multiview applications. The monoview DVC works on encoding only a few selected frames at an encoder of a transmitter and by using interpolation or extrapolation techniques at the decoder of a receiver to restore remaining frames. Therefore, some of the DVC concepts have been applied to MVC, as DVC is designed to achieve low complexity encoder and to address the drawbacks of MVC. The key objective of multiview distributed video coding (MDVC) is to efficiently encode different video streams at the transmitter, by exploiting the possible redundancies at the decoder of the receiver, thus obtaining benefits inherent to DVC, such as lower encoding complexity and embedded error resilience without needing intercommunication between different cameras. The MDVC achieves these objectives by encoding only few key video frames using standard predictive coding methods at the transmitter and sending to the decoder of the receiver and by sending only a few optimal number of syndrome bits of non-key video frames to the decoder of the receiver. In addition, the non-key video frame syndrome bits received are used for correcting errors of interpolated or extrapolated non-key video frames using the key video frames at the decoder of the receiver.

One of the key challenges of MDVC is optimal rate at which the syndrome bits need to be sent from the encoder of the transmitter to the decoder of the receiver for non-key video frames to achieve a required quality level. In existing DVC techniques, typically, a feedback channel is deployed through which the decoder of the receiver does rate control, which can be impractical in systems without feedback channel. Also, in other existing techniques, encoder/transmitter based rate estimation is deployed, which estimates syndrome bit rate using low-complex rate-estimation techniques. These low-complex rate-estimation techniques at the encoder of the transmitter may result in inaccuracies especially with fast moving video sequences and may lead to very low quality decoded video. In addition, these low-complex rate-estimation techniques may have to be applied in parallel to every non-key video frame, which may significantly increase overall encoder/transmitter complexity.

SUMMARY

A method and system for multiview distributed video coding (MDVC) with adaptive syndrome bit rate control are disclosed. According to one aspect of the present subject matter, multiple groups, including multiple captured video frames coming from associated multiple digital cameras, are formed based on a predetermined criteria by a transmitter. Further, video frames coming from a predetermined number of the multiple digital cameras in each group are declared as key video frames by the transmitter. Furthermore, video frames coming from remaining multiple digital cameras in each group are declared as non-key video frames by the transmitter. In addition, the key video frames in each group are encoded using predictive video encoding to obtain associated encoded bits by the transmitter. Also, the non-key video frames in each group are encoded using Wyner-Ziv (WZ) encoding to obtain associated syndrome bits by the transmitter. The syndrome bits include parity bits and cyclic redundancy check (CRC) bits.

Moreover, the encoded key video frames in each group are decoded using predictive video decoding, to obtain associated decoded bits and the encoded non-key video frames in each group are decoded using WZ decoding and the decoded key video frames with iteratively increasing number of syndrome bits, to obtain associated decoded bits and CRC bits by the transmitter. Further, an optimal number of syndrome bits of video frames in each non-key video frame in each group to be sent to receivers are determined based on a successful WZ decoding by the transmitter. Furthermore, the encoded bits of key video frames and determined optimal number of syndrome bits of each non-key video frame in each group are sent by the transmitter to multiple receivers.

In addition in this aspect of the present subject matter, the encoded key video frames in a user selected group are decoded using predictive video decoding by the receiver. Also, the encoded non-key video frames in the user selected group are decoded using WZ decoding and the decoded key video frames with the determined optimal number of syndrome bits. The receiver estimates the non-key video frames using interpolation or extrapolation of the key video frames and performs error correction in the estimated non-key video frames using the determined optimal number of syndrome bits in the user selected group. Moreover, user selected video frames in the user selected group, coming from an associated decoding, are chosen for viewing.

According to another aspect of the present subject matter, a system includes multiple digital cameras, a transmitter coupled to the multiple digital cameras and one or more receivers coupled to the transmitter. Further, the transmitter includes a multiview distributed video coding (MDVC) encoder and a syndrome bit rate control module. The MDVC encoder further includes predictive video encoders and WZ encoders for video frames coming from digital cameras in each group. Furthermore, each of the one or more receivers includes predictive video decoders, WZ decoders and a video frames selector coupled to the predictive video decoders and the WZ decoders.

In one embodiment, the transmitter forms multiple groups, including multiple captured video frames coming from associated multiple digital cameras, based on a predetermined criteria. Further, the transmitter declares video frames coming from a predetermined number of the multiple digital cameras in each group as key video frames. Furthermore, the transmitter declares video frames coming from remaining multiple digital cameras in each group as non-key video frames.

In addition, the transmitter encodes the key video frames in each group to obtain associated encoded bits using predictive video encoder. Moreover, the transmitter encodes the non-key video frames in each group to obtain associated syndrome bits using WZ encoder. Further, the syndrome bit rate control module decodes the encoded key video frames in each group using associated predictive video decoders, to obtain associated decoded bits and decodes the encoded non-key video frames in each group using associated WZ decoders and the decoded key video frames with iteratively increasing number of syndrome bits, to obtain associated decoded bits and CRC bits. Furthermore, the syndrome bit rate control module determines an optimal number of syndrome bits of video frames in each non-key video frame in each group to be sent to the one or more receivers based on a successful WZ decoding. In addition, the transmitter sends encoded bits of key video frames and the determined optimal number of syndrome bits of each non-key video frame in each group to the one or more receivers.

Further in this embodiment, one of the one or more receivers decodes the encoded key video frames in a user selected group using associated predictive video decoders. The one of the one or more receivers decodes the encoded non-key video frames in the user selected group using associated WZ decoders and the decoded key video frames with determined optimal number of syndrome bits by estimating the non-key video frames using interpolation or extrapolation of the key video frames and performing error correction in the estimated non-key video frames using determined optimal number of syndrome bits in the user selected group. Furthermore, the video frames selector chooses user selected video frames in the user selected group, coming from an associated decoding, for viewing.

According to yet another aspect of the present subject matter, a non-transitory computer-readable storage medium for MDVC based on adaptive syndrome bit rate control, when executed by a computing device, cause the computing device to perform the method described above.

The system and method disclosed herein may be implemented in any means for achieving various aspects. Other features will be apparent from the accompanying drawings and from the detailed description that follow.

BRIEF DESCRIPTION OF THE DRAWINGS

Various embodiments are described herein with reference to the drawings, wherein:

FIG. 7 illustrates a table including bit rates, allocated to various incoming video frames associated with groups, maintained by a rate normalizer, such as those shown in FIG. 5, according to one embodiment;

The systems and methods disclosed herein may be implemented in any means for achieving various aspects. Other features will be apparent from the accompanying drawings and from the detailed description that follow.

DETAILED DESCRIPTION

A method and system for multiview distributed video coding (MDVC) with adaptive syndrome bit rate control are disclosed. In the following detailed description of the embodiments of the present subject matter, references are made to the accompanying drawings that form a part hereof, and in which are shown by way of illustration specific embodiments in which the present subject matter may be practiced. These embodiments are described in sufficient detail to enable those skilled in the art to practice the present subject matter, and it is to be understood that other embodiments may be utilized and that changes may be made without departing from the scope of the present subject matter. The following detailed description is, therefore, not to be taken in a limiting sense, and the scope of the present subject matter is defined by the appended claims.

The term "view" refers to a series of captured video frames coming from a digital camera.

Figure 1:
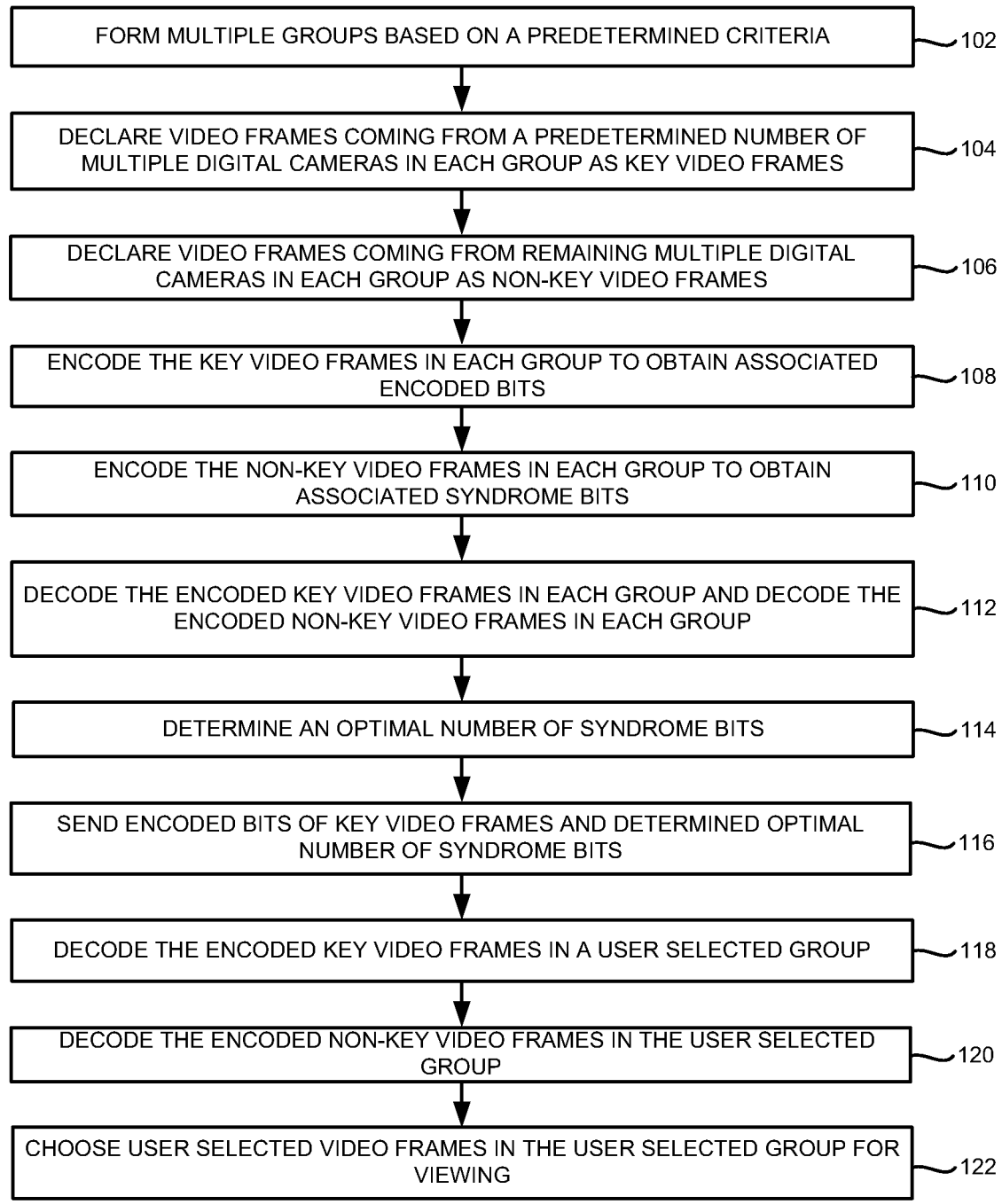
FIG. 1 illustrates a flowchart of a method for MDVC with adaptive syndrome bit rate control, according to one embodiment.

FIG. 1 illustrates a flowchart 100 of a method for MDVC with adaptive syndrome bit rate control, according to one embodiment. At block 102, multiple groups, including multiple captured video frames coming from associated multiple digital cameras, are formed based on a predetermined criteria by a transmitter. Exemplary predetermined criteria include correlation between captured video frames based on substantially similar objects viewed by the multiple digital cameras and/or based on proximity of multiple digital cameras, coming from the multiple digital cameras.

At block 104, video frames coming from a predetermined number of the multiple digital cameras in each group are declared as key video frames by the transmitter. For example, the predetermined number is less than or equal to 2. At block 106, video frames coming from remaining multiple digital cameras in each group are declared as non-key video frames by the transmitter.

At block 108, the key video frames in each group are encoded using predictive video encoding to obtain associated encoded bits by the transmitter. In this embodiment, the predictive video encoding is based on standard encoding techniques, such as an advanced video coding (H.264), moving picture experts group (MPEG)2, video codec(VC)1 and codec developed by DivX, Inc. (DivX). At block 110, the non-key video frames in each group are encoded using Wyner-Ziv (WZ) encoding to obtain associated syndrome bits by the transmitter. The syndrome bits include parity bits and cyclic redundancy check (CRC) bits. For example, the total number of syndrome bits depends on a frame resolution, a block size used for transform and/or quantization parameters. In one embodiment, the WZ encoding includes block based transform, quantization and/or rate adaptive channel encoding. This is explained in more detail with reference to FIG. 4.

At block 112, the encoded key video frames in each group are decoded using predictive video decoding, to obtain associated decoded bits and the encoded non-key video frames in each group are decoded using WZ decoding and the decoded key video frames. For example, the WZ decoding includes a rate adaptive channel decoding, side information generation, inverse quantization and/or inverse transform. This is explained in more detail with reference to FIG. 6. In one embodiment, one of the formed groups is selected and the encoded key video frames in the selected group and the syndrome bits of one of the non-key video frames are selected from the selected group by the transmitter. Further, the encoded key video frames in the selected group are decoded using predictive video decoding, to obtain associated decoded bits and the selected encoded non-key video frames in the selected group are decoded using WZ decoding and the decoded key video frames with iteratively increasing number of the syndrome bits, to obtain associated decoded bits and CRC bits by the transmitter. This is explained in more detail with reference to FIG. 5.

At block 114, an optimal number of syndrome bits of video frames in each non-key video frame in each group to be sent to receivers are determined based on a successful WZ decoding by the transmitter. The successful WZ decoding includes an iteration at which increasing the syndrome bits makes hamming distance between syndrome bits and decoded bits to be substantially 0 and CRC of encoded bits and decoded bits to substantially match. This is explained in more detail with reference to FIGS. 2 and 3. In one embodiment, the determined optimal number of syndrome bits of all the non-key video frames of all the groups, are normalized, such that their sum does not exceed available transmission bandwidth by the transmitter. This is explained in more detail with reference to FIG. 5.

At block 116, the encoded bits of key video frames and determined optimal number of syndrome bits of each non-key video frame in each group are sent to multiple receivers by the transmitter. In one embodiment, the encoded bits of key video frames and the normalized optimal number of syndrome bits of each non-key video frame of each group are sent to the multiple receivers by the transmitter. This is explained in more detail with reference to FIG. 3.

At block 118, the encoded key video frames in a user selected group are decoded using predictive video decoding by the receiver. At block 120, the encoded non-key video frames in the user selected group are decoded using WZ decoding and the decoded key video frames with the determined optimal number of syndrome bits. The receiver estimates the non-key video frames using interpolation or extrapolation of the key video frames and performs error correction in the estimated non-key video frames using the determined optimal number of syndrome bits in the user selected group. At block 122, user selected video frames in the user selected group, coming from an associated decoding, are chosen for viewing. This is explained in more detail with reference to FIG. 3.

Figure 2:
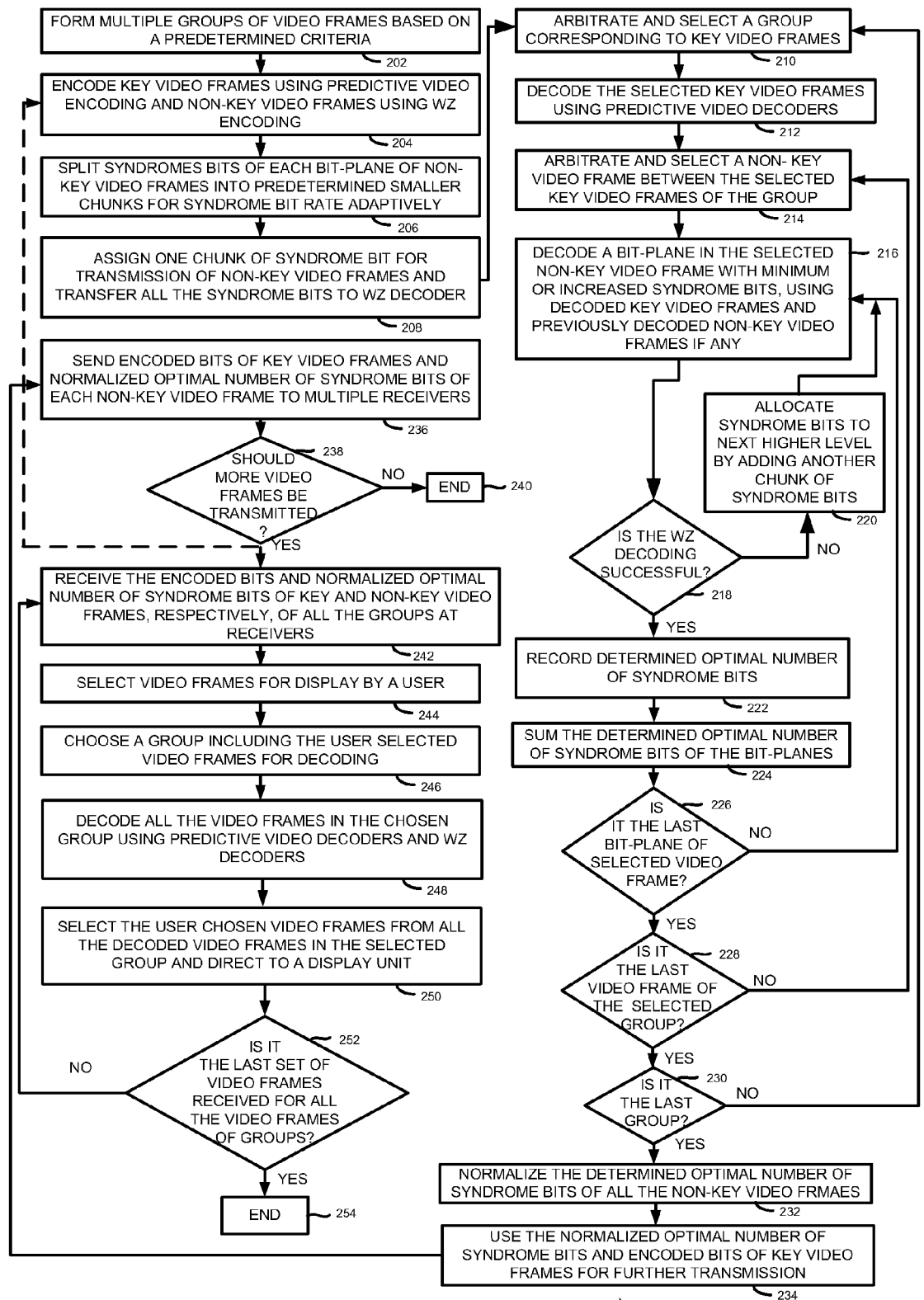
FIG. 2 illustrates another flowchart of a method for MDVC with adaptive syndrome bit rate control, according to one embodiment.

Referring now to FIG. 2, another flowchart 200 illustrates a method for MDVC with adaptive syndrome bit rate control, according to one embodiment. At block 202, multiple groups of video frames are formed based on predetermined criteria. In one embodiment, the multiple groups are formed using multiple captured video frames coming from associated multiple digital cameras. Exemplary predetermined criteria includes correlation between captured video frames based on substantially similar objects viewed by the multiple digital cameras and/or based on proximity of multiple digital cameras, coming from multiple digital cameras. Further, video frames coming from a predetermined number of the multiple cameras in each group are declared as key video frames. For example, the predetermined number is less than or equal to 2. Furthermore, video frames coming from remaining multiple digital cameras in each group are declared as non-key video frames. This is explained in more detail with reference to FIG. 3.

At block 204, the key video frames in each group are encoded using predictive video encoding and the non-key video frames in each group are encoded using WZ encoding. In one embodiment, the key video frames in each group are encoded to obtain encoded bits. Further, the non-key video frames in each group are encoded to obtain syndrome bits. The syndrome bits include parity bits and CRC bits. This is explained in more detail with reference to FIG. 3.

At block 206, the syndrome bits of each bit-plane of the non-key video frames are split into predetermined smaller chunks for syndrome bit rate adaptability. In one embodiment, each non-key video frame includes multiple bit-plane. Further, each bit-plane includes multiple syndrome bits. At block 208, one chunk of syndrome bit is assigned for transmission of the non-key video frames and all the syndrome bits are transferred to a WZ decoder (e.g., a WZ decoder 504 of FIG. 5). At block 210, a group corresponding to key video frames is selected by arbitration. This is explained in more detail with reference to FIG. 5.

At block 212, the selected key video frames are decoded using predictive video decoders. At block 214, a non-key video frame between the selected key video frames of the group is selected by arbitration. At block 216, a bit-plane in the selected non-key video frame is decoded with minimum or increased syndrome bits using decoded key video frames and previously decoded non-key video frames, if any, using WZ decoding. This is explained in more detail with reference to FIG. 5.

At block 218, it is determined whether the WZ decoding is successful. At block 220, the syndrome bits are allocated to next higher level by adding another chunk of syndrome bits, if the WZ decoding is not successful. Further, the process steps are repeated from the block 216. At block 222, an optimal number of syndrome bits are determined and recorded, if the WZ decoding is successful. At block 224, the determined number of syndrome bits of the bit-planes of the non-key video frames is summed. This is explained in more detail with reference to FIG. 5.

At block 226, it is determined whether it is the last bit-plane of the selected non-key video frame. The process steps are repeated from the block 216, if it is not the last bit-plane of the selected non-key video frame. At block 228, it is determined whether it is the last video frame of the selected group, if it is the last bit-plane of the selected non-key video frame. The process steps are repeated from the block 214, if it is not the last video frame of the selected group. At block 230, it is determined whether it is the last group, if it is the last video frame of the selected group. The process steps are repeated from the block 210, if it is not the last group. At block 232, the determined optimal number of syndrome bits of all the non-key video frames is normalized, if it is the last group. This is explained in more detail with reference to FIG. 5.

At block 234, the normalized optimal number of syndrome bits and the encoded bits of key video frames are used for further transmission. At block 236, encoded bits of the key video frames and the normalized optimal number of syndrome bits of each non-key video frame are sent to multiple receivers. At block 238, it is determined whether more video frames should be transmitted. The process steps are repeated from the block 204 if more video frames should be transmitted. At block 240, the process ends if more video frames should not be transmitted.

At block 242, the encoded bits and normalized optimal number of syndrome bits of the key video frames and the non-key video frames, respectively, of all the groups are received at the multiple receivers. At block 244, video frames are selected for display by a user. At block 246, a group including the user selected video frames is selected for decoding. At block 248, all the video frames in the chosen group are decoded using predictive video decoders and WZ decoders. At block 250, the user chosen video frames are selected form all the decoded video frames in the selected group and directed to a display unit. At block 252, it is determined whether it is the last set of video frames received for all the video frames of the selected groups. The process steps are repeated from the block 242, if it is not the last set of video frames received for all the video frames of the selected groups. At block 254, the process ends if it is the last set of video frames received for all the video frames of the selected groups.

Figure 3:
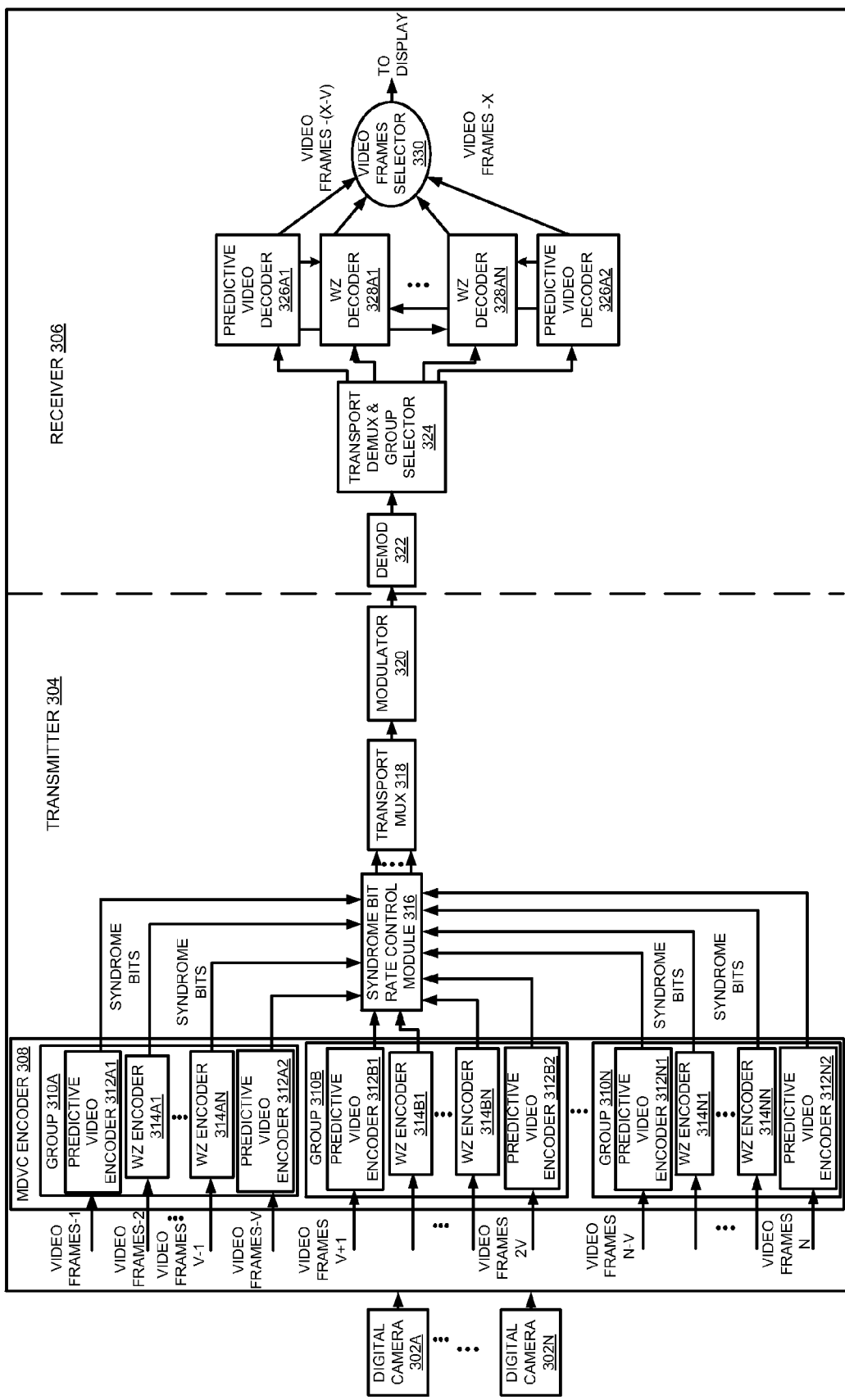
FIG. 3 illustrates a block diagram including major components of a system for adaptive syndrome bit rate control in MDVC, according to one embodiment.

Referring now to FIG. 3, a block diagram 300 illustrates major components of a system for adaptive syndrome bit rate control in MDVC, according to one embodiment. As shown, the system includes multiple digital cameras 302A-N, a transmitter 304 and a receiver 306. Further as shown in FIG. 3, the transmitter 304 includes MDVC encoder 308, a syndrome bit rate control module 316, a transport multiplexer (mux) 318, and a modulator 320. Furthermore as shown in FIG. 3, the receiver 306 includes a demodulator (demod) 322, a transport demultiplexer (demux) and group selector 324, predictive video decoders 326A1 and 326A2, WZ decoders 328A1-AN and a video frames selector 330.

In addition as shown in FIG. 3, the MDVC encoder 308 includes groups 310A-N. Moreover as shown in FIG. 3, each of the groups 310A-N includes predictive video encoders 312A1-A2 to 312N1-N2, respectively. Also as shown in FIG. 3, each of the groups 310A-N includes WZ encoders 314A1-AN to 314N1-NN, respectively.

Further as shown in FIG. 3, the digital cameras 302A-N are coupled to the transmitter 304. In one embodiment, the digital cameras 302A-N are coupled to the MDVC encoder 308. Furthermore as shown in FIG. 3, the MDVC encoder 308 is coupled to the syndrome bit rate control module 316. In addition as shown in FIG. 3, the transport mux 318 is coupled between the syndrome bit rate control module 316 and the modulator 320. Also as shown in FIG. 3, the demodulator 322 is coupled between the modulator 320 and the transport demux and group selector 324. Moreover as shown in FIG. 3, the transport demux and group selector 324 is coupled to the predictive video decoders 326A1-A2 and WZ decoders 328A1-AN. The predictive video decoders 326A1-A2 and WZ decoders 328A1-AN are further coupled to the video frames selector 330.

In operation, the transmitter 304 forms multiple groups, including multiple captured video frames coming from associated digital cameras 302A-N, based on a predetermined criteria. Exemplary predetermined criteria include correlation between captured video frames based on substantially similar objects viewed by the digital cameras 302A-N and/or based on proximity of the digital cameras 302A-N. For example, each group includes at least V video frames.

Further in operation, the video frames coming from each group of digital cameras 302A-N is transmitted to an associated one of the groups 310A-N. In one embodiment, the transmitter 304 declares video frames coming from a predetermined number of the digital cameras 302A-N in each of the groups 310A-N as key video frames. The predetermined number is less than or equal to 2. For example, in group 310A, video frames −1 and video frames −V coming from associated digital cameras 302A-N are declared as the key video frames. Further in this embodiment, the transmitter 304 declares video frames coming from remaining digital cameras 302A-N in each of the groups 310A-N as non-key video frames. For example, in group 310A, video frames −2 to video frames V−1 coming from associated remaining digital cameras 302A-N are declared as the non-key video frames.

Furthermore in operation, the MVDC encoder 308 encodes the key video frames in each of the groups 310A-N using associated predictive video encoders 312A1-A2 to 312N1-N2 to obtain associated encoded bits. For example, the key video frames in the group 310A, the video frames −1 and the video frames −V, are encoded in the predictive video encoder 312A1 and the predictive video encoder 312A2, respectively. In one embodiment, the predictive video encoders 312A1-A2 to 312N1-N2 are based on standard encoding techniques, such as advanced video coding (H.264), moving picture experts group (MPEG)2, video codec(VC)1 and codec developed by DivX, Inc. (DivX).

In addition in operation, the MDVC encoder 308 encodes the non-key video frames in each of the groups 310A-N using associated WZ encoders 314A1-AN to 314N1-NN to obtain associated syndrome bits. The syndrome bits include parity bits and CRC bits. For example, the non-key video frames in the group 310A, the video frames −2 to the video frames −V−1, are encoded in the WZ encoders 314A1-AN, respectively. In one embodiment, the WZ encoders 314A1-NN include block based transform, quantization and/or rate adaptive channel encoding. This is explained in more detail with reference to FIG. 4.

Moreover in operation, the encoded bits of all the key video frames of the groups 310A-N and the syndrome bits of all the non-key video frames of the groups 310A-N are sent to the syndrome bit rate control module 316. The syndrome bit rate control module 316 decodes the encoded key video frames of the groups 310A-N using predictive video decoders (e.g., predictive video decoders 506A and 506B of FIG. 5) to obtain associated decoded bits. Further, the syndrome bit rate control module 316 decodes the encoded non-key video frames of the groups 310A-N using a WZ decoder (e.g., a WZ decoder 504 of FIG. 5) and the decoded key video frames with iteratively increasing number of syndrome bits to obtain associated decoded bits and CRC bits. Also in operation, an optimal number of syndrome bits of video frames in each non-key video frame in each of the groups 310A-N are determined based on a successful WZ decoding by the syndrome bit rate control module 316. In one embodiment, the successful WZ decoding includes an iteration at which increasing the syndrome bits makes hamming distance between syndrome bits and decoded bits to be substantially 0 and CRC of encoded bits and decoded bits to substantially match. This is explained in more detail with reference to FIGS. 2 and 5.

Further in operation, the determined optimal number of syndrome bits of all the non-key video frames is normalized, such that their sum does not exceed available transmission bandwidth. This is explained in more detail with reference to FIG. 5. Furthermore in operation, the encoded bits of each key video frame and the normalized optimal number of syndrome bits of each non-key video frame in each of the groups 310A-N are sent to the receiver 306 via the transport mux 318 and the modulator 320. In one embodiment, the transport mux 318 time division multiplexes the encoded bits of each key video frame and the normalized optimal number of syndrome bits of each non-key video frame of all the groups 310A-N to form transport streams. Further, the modulator 320 modulates the formed transport streams and outputs the modulated transport streams to the receiver 306 via a wired or wireless network.

In addition in operation, in the receiver 306, the demux 322 extracts the transport streams from the received modulated transport streams. Moreover, a user selects video frames for displaying on a display unit. Further, a group including the user selected video frames is selected by the transport demux and group selector 324. Furthermore, the receiver 306 decodes the encoded key video frames in the user selected group using the predictive video decoders 326A1 and 326A2. In addition, the encoded non-key video frames in the user selected group is decoded using the WZ decoders 328A1-AN and the decoded key video frames with the normalized optimal number of syndrome bits. In one embodiment, the receiver 306 estimates the non-key video frames using interpolation or extrapolation of the key video frames and performs error correction in the estimated non-key video frames using the determined optimal number of syndrome bits in the user selected group. Also, the video frames selector 330 chooses video frames in the user selected group for viewing. This is explained in more detail with reference to FIG. 2.

Figure 4:
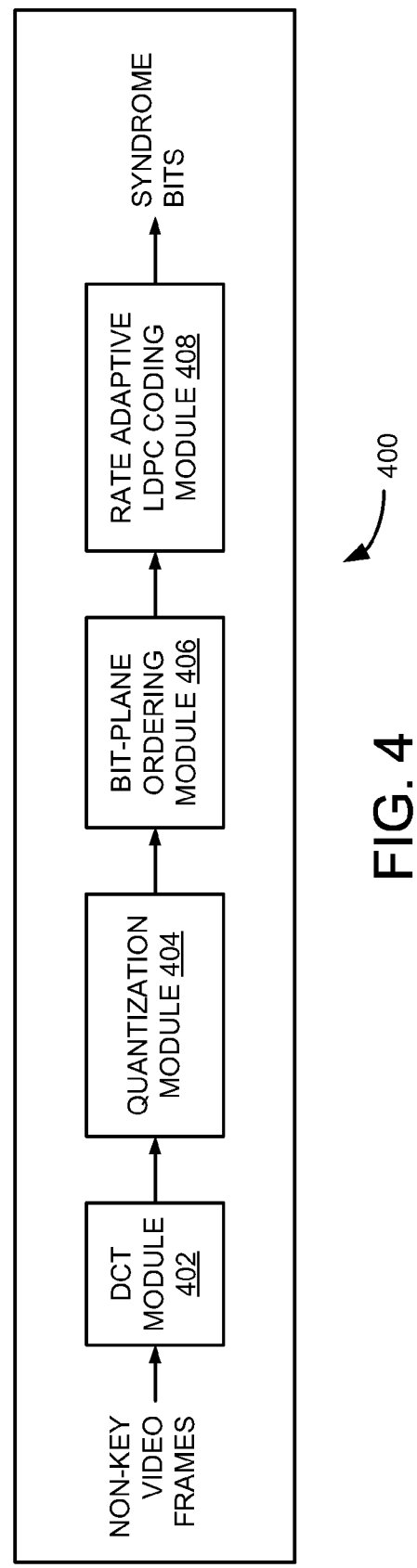
FIG. 4 illustrates a block diagram including major components of a Wyner-Ziv (WZ) encoder, such as those shown in FIG. 3, according to one embodiment.

Referring now to FIG. 4, a block diagram illustrates major components of a WZ encoder 400, such as those shown in FIG. 3, according to one embodiment. The WZ encoders 314A1-AN to 314N1-NN, shown in FIG. 3, have similar components as shown in the WZ encoder 400. As shown, the WZ encoder 400 includes a discrete cosine transform (DCT) module 402, a quantization module 404, a bit-plane ordering module 406 and a rate adaptive low density parity check (LDPC) coding module 408. Further as shown in FIG. 4, the DCT module 402 is coupled to the quantization module 404. Furthermore as shown in FIG. 4, the bit-plane ordering module 406 is coupled between the quantization module 404 and the rate adaptive LDPC coding module 408.

Figure 5:
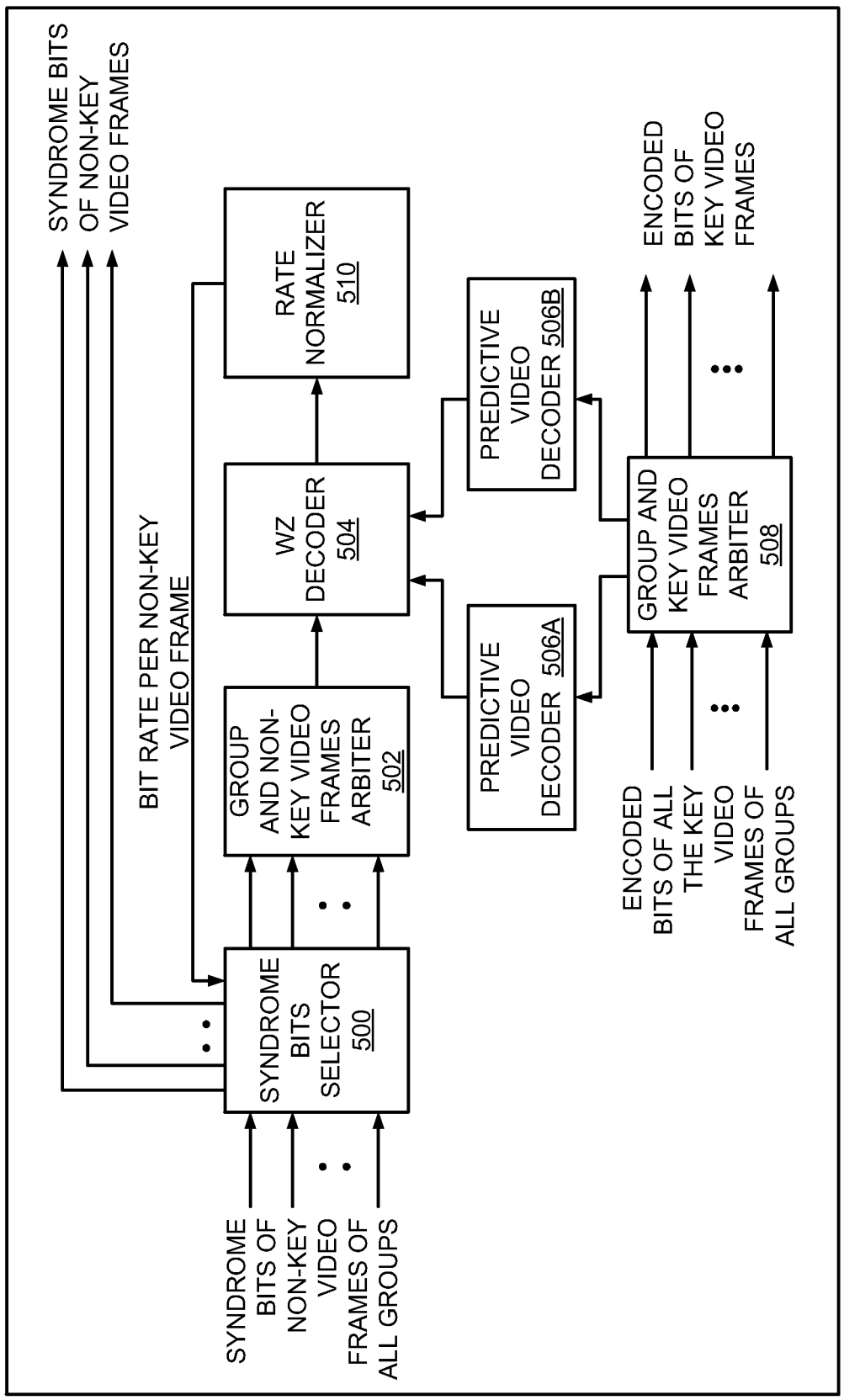
FIG. 5 illustrates a block diagram including major components of an adaptive syndrome bit rate control module, such as the one shown in FIG. 3, according to one embodiment.

In operation, each incoming non-key video frame is partitioned into predetermined block sizes. Further, DCT is applied on each block in the DCT module 402. Furthermore, each block is quantized to predetermined levels in the quantization module 404. In addition, bit-planes are formed by combining bits in each block of same significance. Also, LDPC codes are applied to each bit-plane in the rate adaptive LDPC coding module 408. For example, the total number of bit-planes per non-key video frame depends on the number of quantization levels. The total number of syndrome bits generated per non-key video frame depends on factors, such as non-key video frame resolution, block size used by the DCT module 402 and quantization parameters. The total number of syndrome bits generated per bit-plane is computed as:

Total syndrome bits per bit-plane=(number of pixels per line*number of lines per frame)/number of pixels in each transformed block Referring now to FIG. 5, a block diagram illustrates major components of the syndrome bit rate control module 316, such as the one shown in FIG. 3, according to one embodiment. As shown, the syndrome bit rate control module 316 includes a syndrome bits selector 500, a group and non-key video frames arbiter 502, a WZ decoder 504, predictive video decoders 506A and 506B, a group and key video frames arbiter 508 and a rate normalizer 510.

Further as shown in FIG. 5, the syndrome bits selector 500 is coupled to the group and non-key video frames arbiter 502. Furthermore, the group and non-key video frames arbiter 502 is coupled to the WZ decoder 504. In addition, the WZ decoder 504 is coupled to the predictive video decoders 506A and 506B and the rate normalizer 510. Also, the predictive video decoders 506A and 506B are coupled to the group and key video frames arbiter 508.

In operation, the syndrome bit rate control module 316 receives syndrome bits of all the non-key video frames of all the groups 310A-N, shown in FIG. 3, and the encoded bits of all the key video frames of all the groups 310A-N. Particularly, the syndrome bits selector 500 receives the syndrome bits of all the non-key video frames of all groups 310A-N and the group and key video frames arbiter 508 receives the encoded bits of all the key video frames.

Further in operation, the syndrome bits selector 500 sends the syndrome bits of all the non-key video frames of all the groups 310A-N to the group and non-key video frames arbiter 502. The group and non-key video frames arbiter 502 arbitrates among the non-key video frames, in a round robin fashion, starting from a predetermined non-key video frame. Furthermore, the group and non-key video frames arbiter 502 sends the syndrome bits of a selected non-key video frame to the WZ decoder 504. In addition in operation, the group and key video frames arbiter 508 arbitrates among the key video frames, in a round robin fashion, starting from two key video frames corresponding to predetermined non-key video frames. Also in operation, the group and key video frames arbiter 508 outputs encoded bits of selected two key video frames to the predictive video decoders 506A and 506B. For example, considering group 310A with the video frames −1 to the video frames −V, as shown in FIG. 3, the group and non-key video frame arbiter 502 outputs all the syndrome bits corresponding to the video frames −2 to video frames −V−1, sequentially. Further, the group and key video frame arbiter 508 outputs encoded bits corresponding to the video frames −1 and video frames −V.

Furthermore in operation, the predictive video decoders 506A and 506B decodes the encoded bits of all the key video frames and routes the decoded key video frames to the WZ decoder 504. In addition in operation, the WZ decoder 504 estimates the non-key video frames using the decoded key video frames and previously decoded non-key video frames. For example, the WZ decoder 504 uses motion compensated temporal interpolation method for the estimation of the non-key video frames. Also, the WZ decoder 504 determines the optimal number of syndrome bits for each non-key video frame based on a successful WZ decoding. This is explained in more detail with reference to FIG. 6.

Moreover in operation, the rate normalizer 510 receives the determined optimal number of syndrome bits for each non-key video frame. Further, the rate normalizer 510 maintains a table including the determined optimal number of syndrome bits for each of the non-key video frames. This is explained in more detail with reference to FIG. 7. In one embodiment, the rate normalizer 510 receives the determined optimal number of syndrome bits for all the bit-planes in a non-key video frame in one frame time. Therefore, the time required to obtain the determined optimal number of syndrome bits for all the non-key video frames in the groups 310A-N is given by:

$$\text{Time} = (V-2)*G$$

wherein, V is the number of video frames in each group and G is the number of groups.

In addition in operation, after the determined optimal number of syndrome bits for all the non-key video frames in the groups 310A-N is obtained by the rate normalizer 510, the determined optimal number of syndrome bits for all the non-key video frames is normalized. In one embodiment, the determined optimal number of syndrome bits for all the non-key video frames are normalized, such that their sum does not exceed available transmission bandwidth. If the normalized optimal number of syndrome bits for all the non-key video frames exceeds the available transmission bandwidth, then the syndrome bits for some or all the non-key video frames will be linearly scaled down.

Moreover in operation, the normalized optimal number of syndrome bits for all the non-key video frames is sent to the syndrome bits selector 500. The syndrome bits selector 500 then sends the encoded bits of the key video frames and the optimal number of syndrome bits for each non-key video frame to the receiver 306.

Figure 6:
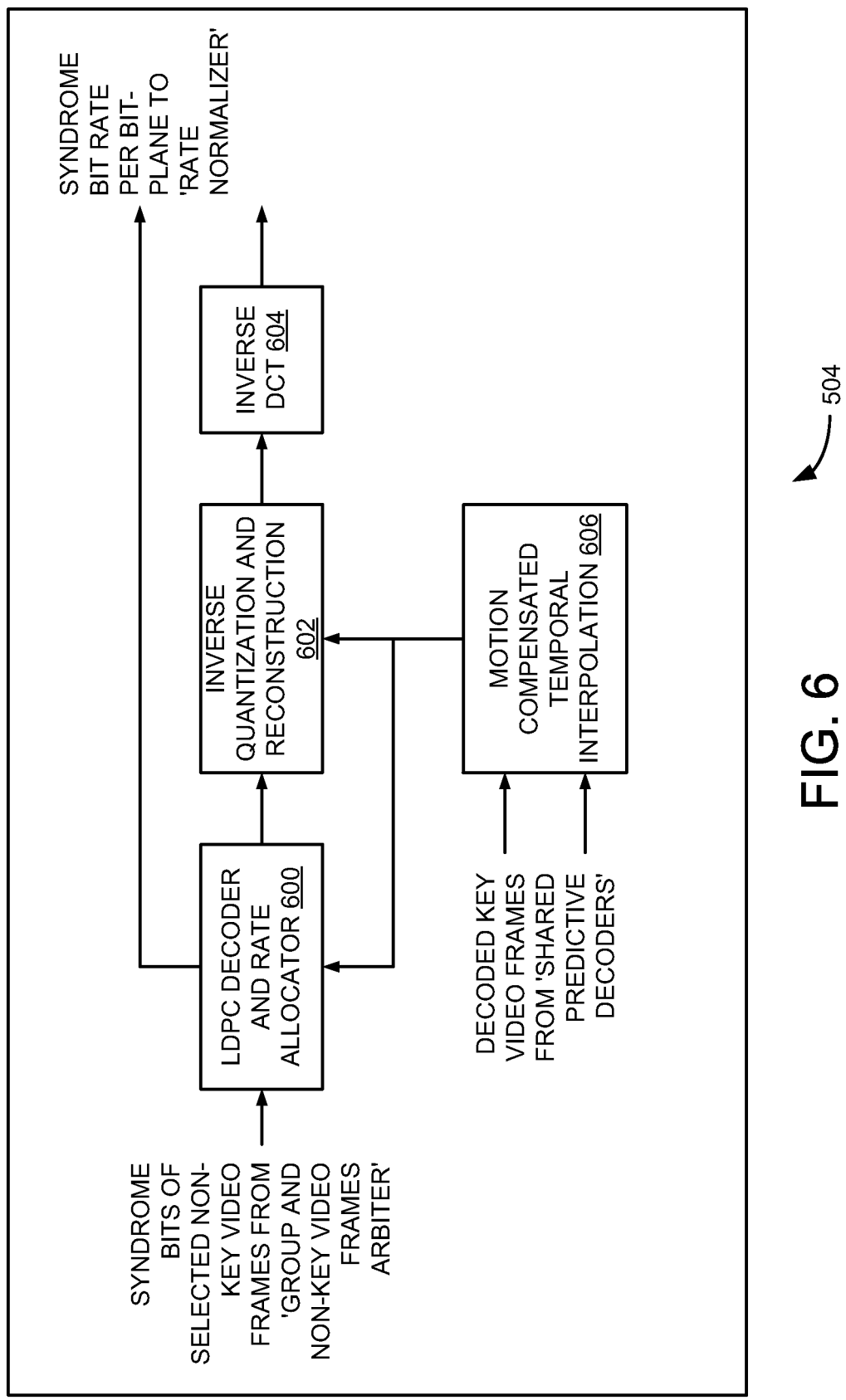
FIG. 6 illustrates a block diagram including major components of a shared WZ decoder, such as the one shown in FIG. 5, according to one embodiment.

Referring now to FIG. 6, a block diagram illustrates major components of the WZ decoder 504, such as the one shown in FIG. 5, according to one embodiment. As shown, the WZ decoder 504 includes a LDPC decoder and rate allocator 600, an inverse quantization and reconstruction 602, inverse DCT 604 and a motion compensated temporal interpolation 606. Further as shown in FIG. 6, the LDPC decoder and rate allocator 600 is coupled to the inverse quantization and reconstruction 602 and the motion compensated temporal interpolation 606. Furthermore as shown in FIG. 6, the inverse quantization and reconstruction 602 is coupled to the motion compensated temporal interpolation 606 and the inverse DCT 604.

In operation, the LDPC decoder and rate allocator 600 receives syndrome bits of selected non-key video frames from the group and non-key video frames arbiter 502, shown in FIG. 5. Further, the LDPC decoder and rate allocator 600 iteratively decodes each bit-plane in the selected non-key video frames using estimated non-key video frames and previously decoded bit-planes, if any. Initially, the LDPC decoder decodes the non-key video frames with lowest number of syndrome bits (for example, one chunk of syndrome bits). Further, the rate allocator checks if the decoded bit-plane is of the desired quality using the algorithm:

```
For i=1 to G
    For j=2 to V−1
        For k= 1 to P
            For l=1 to R
            {   LDPC decode
                If (hamming distance = 0 and CRC match)
                    Allocated syndrome bits= l}
``` wherein, P is the number of bit-planes per video frame and R is the bit rate in terms of number of chunks per bit-plane.

In the above algorithm, it is determined whether the decoded bit-plane is of the desired quality. In one embodiment, the decoded bit-plane is of the desired quality when hamming distance between syndrome bits and decoded bits to be substantially 0 and CRC of encoded bits and decoded bits substantially match. Further, if the decoded bit-plane is not of the desired quality then the rate allocator indicates the LDPC decoder to decode using an additional chunk of syndrome bits. Furthermore, the optimal number of syndrome bits with which the decoding is successful is recorded by the rate normalizer 510, shown in FIG. 5. This is explained in detail with reference to FIGS. 5 and 7.

Referring now to FIG. 7, a table 700 includes optimal number of syndrome bits, allocated to various incoming non-key video frames associated with groups, maintained by a rate normalizer, such as those shown in FIG. 5, according to one embodiment. As shown in the table 700, column 702 includes the group number. Further, column 704 includes the video frames number. Furthermore, column 706 includes the bit-plane number. In addition, column 708 includes the determined optimal number of syndrome bits for each bit-plane. For example, the first row in the table 700 indicates the optimal number of syndrome bits for bit-plane 1 in video frames 2 in group 1 as 1.

Figure 8:
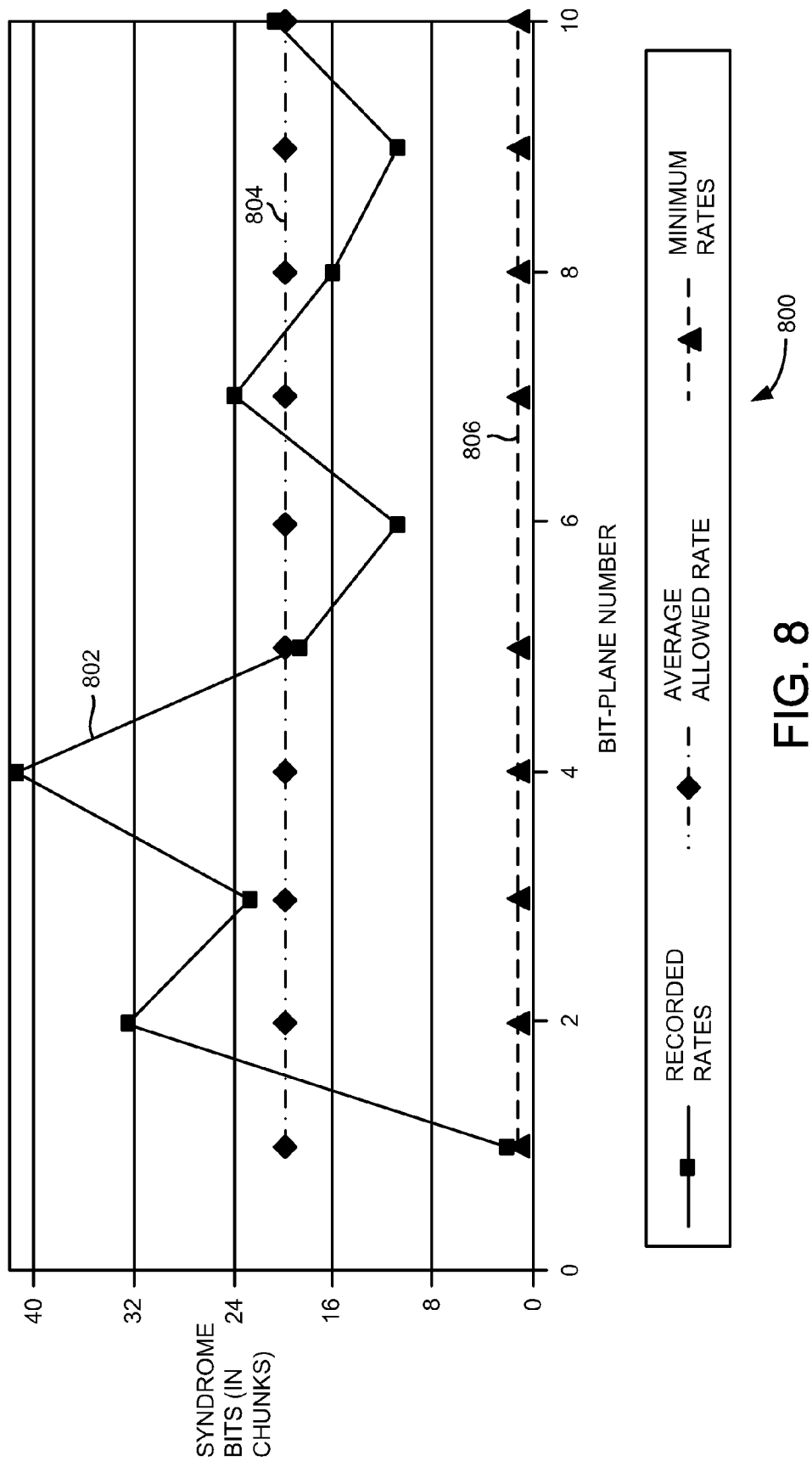
FIG. 8 illustrates a graph allocated syndrome bit rates using method and system shown in FIGS. 1 and 3, according to one embodiment.

Referring now to FIG. 8, a graph 800 illustrates allocated syndrome bit rates using method and system shown in FIGS. 1 and 3, according to one embodiment. As shown in the graph 800, x-axis indicates the bit-plane number and y-axis indicates the syndrome bits in chunks. Further as shown in the graph 800, 802 indicates the recorded optimal number of syndrome bits for each bit-plane. Furthermore as shown in the graph 800, 804 indicates average allowable optimal syndrome bits for each bit-plane. In addition as shown in the graph 800, 806 indicates minimum syndrome bits for each bit-plane.

Figure 9:
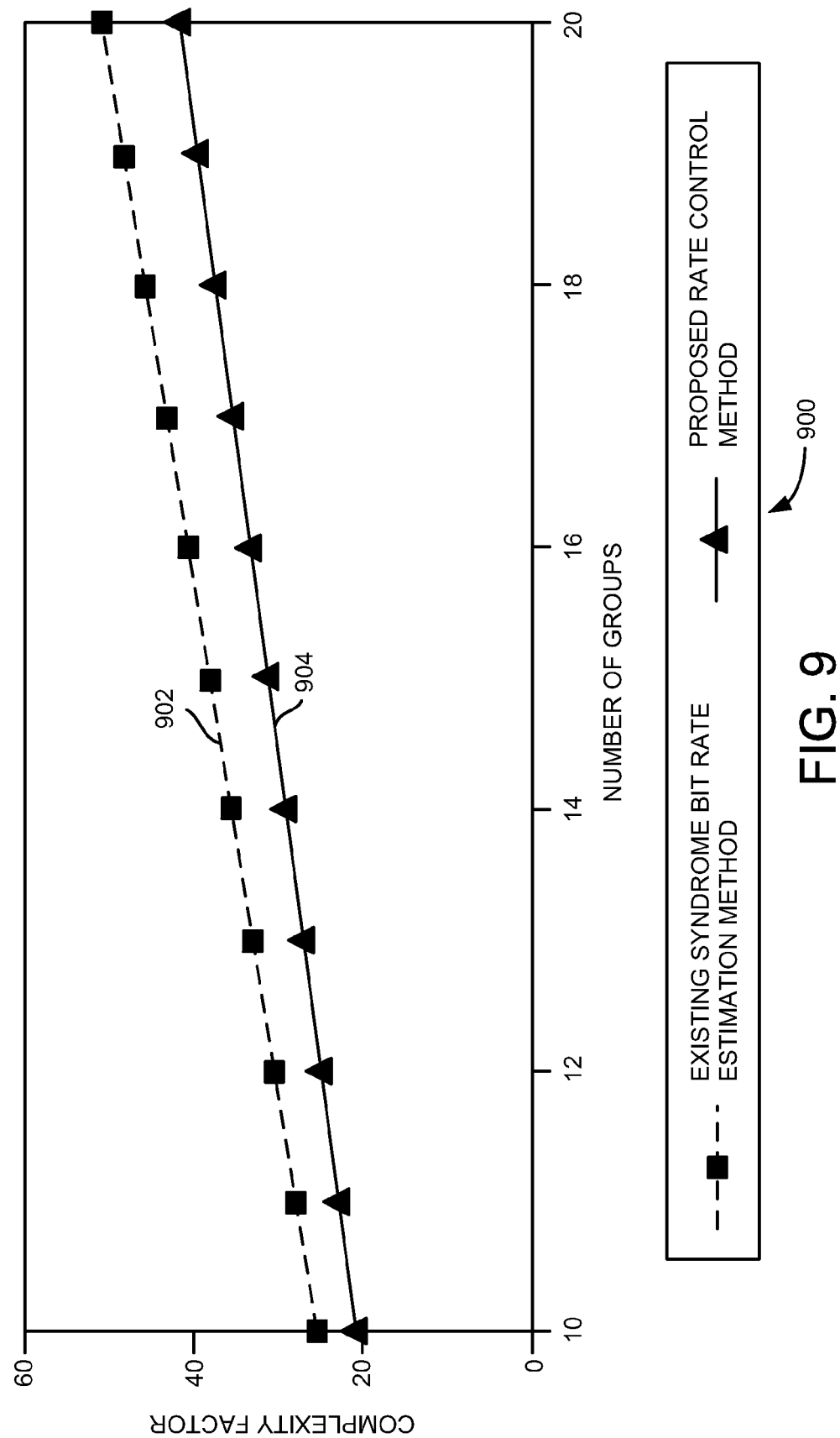
FIG. 9 illustrates exemplary comparison graphs of complexity factor of syndrome bit rate estimation obtained using an existing technique and method and system shown in FIGS. 1 and 3.

Referring now to FIG. 9, exemplary comparison graph 900 illustrates complexity factor of syndrome bit rate estimation obtained using an existing technique and method and system shown in FIGS. 1 and 3. As shown in the graph 900, x-axis indicates complexity factor and y-axis indicates number of groups. Further as shown in the graph 900, 902 indicates the complexity factor in terms of $C_{PE}$ using the existing syndrome bit rate estimation method. Furthermore as shown in the graph 900, 904 indicates the complexity factor in terms of complexity of predictive video encoder ($C_{PE}$) using the syndrome bit rate estimation method described with reference to FIGS. 1 and 3.

Figure 10:
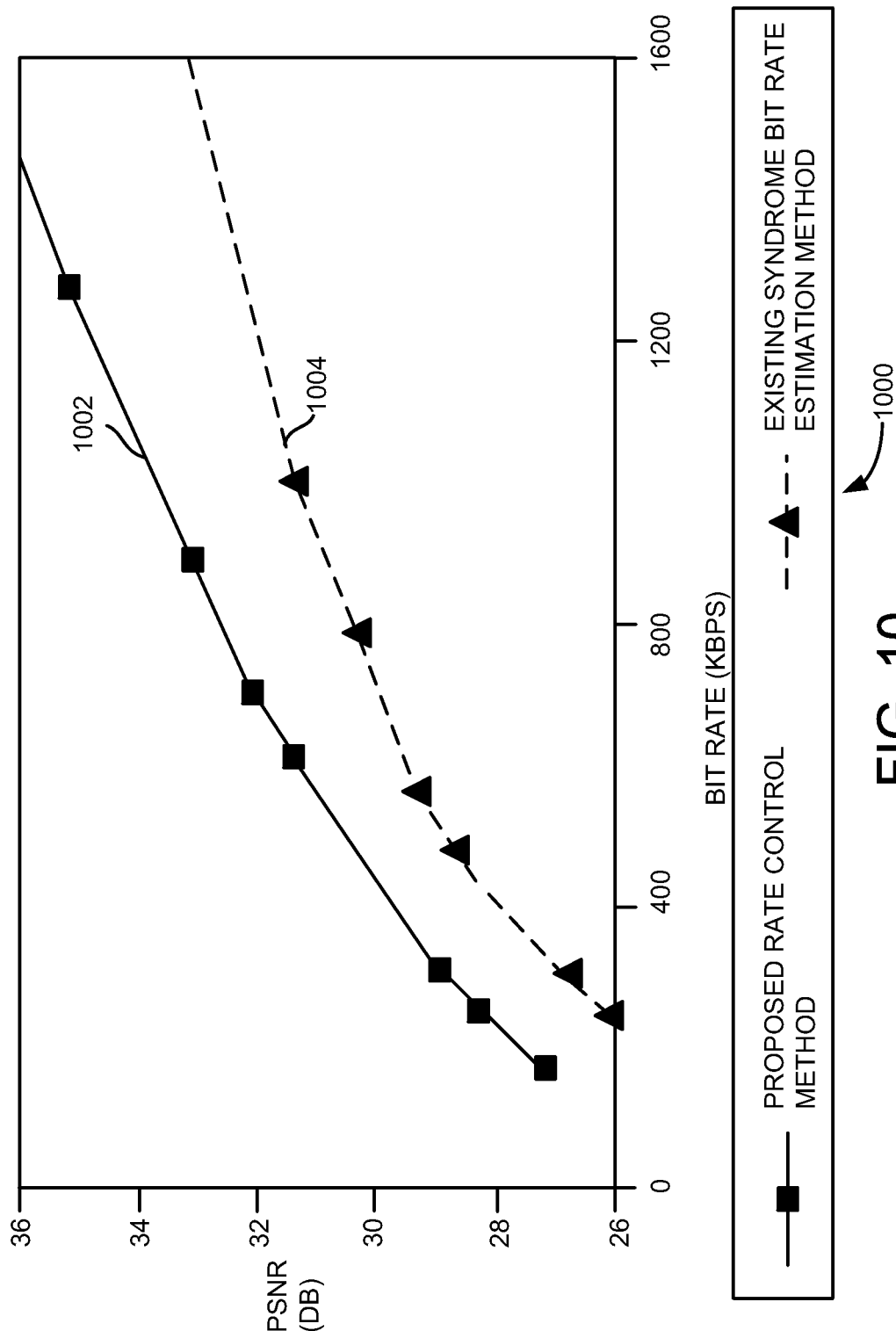
FIG. 10 illustrates exemplary comparison graphs of bit rate distortion obtained using an existing technique and method and system shown in FIGS. 1 and 3.

Referring now to FIG. 10, exemplary comparison graph 100 illustrates bit rate distortion obtained using an existing technique and method and system shown in FIGS. 1 and 3. As shown in the graph 1000, x-axis indicates total syndrome bit rate of a group in Kbps and y-axis indicates average peak signal to noise ratio (PSNR) in dB. Further as shown in the graph 1000, 1002 indicates the PSNR obtained using the syndrome bit rate estimation method described with reference to FIGS. 1 and 3. Furthermore as shown in the graph 1000, 1004 indicates the PSNR obtained using the existing syndrome bit rate estimation method. At a given bit-rate, the PSNR obtained using the syndrome bit rate estimation method described with reference to FIGS. 1 and 3 is up to 2.4 dB better than the PSNR obtained using the existing syndrome bit rate estimation method.

In various embodiments, systems and methods described with reference to FIGS. 1 through 10 propose adaptive syndrome bit rate control in MDVC. Further, the syndrome bit rate control module is used by all the key video frames and the non-key video frames, sequentially, thereby reducing the complexity of the MDVC encoder. Furthermore, no feedback channel is required between the encoders and decoders which further reduces the complexity of the MDVC encoder. In addition, the syndrome bit rate control module is based on actual decoding at the transmitter which results in accurate rate estimates and better decoded video quality.

Although certain methods, systems, apparatus, and articles of manufacture have been described herein, the scope of coverage of this patent is not limited thereto. To the contrary, this patent covers all methods, apparatus, and articles of manufacture fairly falling within the scope of the appended claims either literally or under the doctrine of equivalents.

What is claimed is:

1. A method for adaptive syndrome bit rate control in multiview distributed video coding (MDVC), comprising:
    forming multiple groups, including multiple captured video frames coming from associated multiple digital cameras, based on predetermined criteria by a transmitter;
    declaring video frames coming from a predetermined number of the multiple digital cameras in each group as key video frames by the transmitter;
    declaring video frames coming from remaining multiple digital cameras in each group as non-key video frames by the transmitter;
    encoding the key video frames in each group to obtain associated encoded bits using predictive video encoding by the transmitter;
    encoding the non-key video frames in each group to obtain associated syndrome bits using Wyner-Ziv (WZ) encoding by the transmitter, wherein the syndrome bits include parity bits and cyclic redundancy check (CRC) bits;
    decoding the encoded key video frames in each group using predictive video decoding, to obtain associated decoded bits and decoding the encoded non-key video frames in each group using WZ decoding and the decoded key video frames with iteratively increasing number of syndrome bits, to obtain associated decoded bits and the CRC bits by the transmitter;
    determining an optimal number of syndrome bits of video frames in each non-key video frame in each group to be sent to receivers based on a successful WZ decoding by the transmitter; and
    sending encoded bits of key video frames and determined optimal number of syndrome bits of each non-key video frame in each group by the transmitter to multiple receivers.

2. The method of claim 1, wherein the successful WZ decoding comprises an iteration at which increasing the syndrome bits makes hamming distance between syndrome bits and decoded bits to be substantially 0 and CRC of encoded bits and decoded bits to substantially match.

3. The method of claim 1, further comprising:
    decoding the encoded key video frames in a user selected group using predictive video decoding by the receiver;
    decoding the encoded non-key video frames in the user selected group using WZ decoding and the decoded key video frames with the determined optimal number of syndrome bits comprises estimating non-key video frames using interpolation or extrapolation of the key video frames and performing error correction in the estimated non-key video frames using the determined optimal number of syndrome bits in the user selected group by the receiver; and
    choosing user selected video frames in the user selected group, coming from an associated decoding, for viewing.

4. The method of claim 1, wherein decoding the encoded key video frames in each group using predictive video decoding, to obtain associated decoded bits and decoding the encoded non-key video frames in each group using WZ decoding and the decoded key video frames with iteratively increasing number of syndrome bits, to obtain associated decoded bits and CRC bits by the transmitter comprises:
    selecting one of the formed groups, selecting the encoded key video frames in the selected group and selecting the syndrome bits of one of the non-key video frames from the selected group by the transmitter;
    decoding the encoded key video frames in the selected group using predictive video decoding, to obtain associated decoded bits and decoding the selected encoded non-key video frames in the selected group using WZ decoding and the decoded key video frames with iteratively increasing number of the syndrome bits, to obtain associated decoded bits and CRC bits by the transmitter.

5. The method of claim 1, wherein determining the optimal number of syndrome bits of video frames in each non-key video frame in each group based on a successful WZ decoding by the transmitter further comprises:
    normalizing the determined optimal number of syndrome bits of all the non-key video frames of all the groups, such that their sum does not exceed available transmission bandwidth by the transmitter.

6. The method of claim 1, wherein sending normalized optimal number of syndrome bits comprises:
    sending encoded bits of key video frames and the normalized optimal number of syndrome bits of each non-key video frame of each group by the transmitter to the multiple receivers.

7. The method of claim 1, wherein, in forming, the predetermined criteria comprises correlation between captured video frames based on substantially similar objects viewed by the multiple digital cameras and/or based on proximity of multiple digital cameras, coming from multiple digital cameras.

8. The method of claim 1, wherein predictive video encoding is based on standard encoding techniques selected from the group consisting of advanced video coding (H.264), moving picture experts group (MPEG)2, video codec(VC)1 and codec developed by DivX, Inc. (DivX).

9. The method of claim 1, wherein the predetermined number is less than or equal to 2.

10. The method of claim 1, wherein in encoding the non-key video frames, the total number of syndrome bits depends on a frame resolution, a block size used for transform and/or quantization parameters.

11. The method of claim 1, wherein WZ encoding includes block based transform, quantization and/or rate adaptive channel encoding.

12. The method of claim 1, wherein WZ decoding includes a rate adaptive channel decoding, side information generation, inverse quantization and/or inverse transform.

13. A system, comprising:
    multiple digital cameras, wherein each digital camera outputting associated captured video frames;
    a transmitter coupled to the multiple digital cameras, wherein the transmitter includes a multiview distributed video coding (MDVC) encoder and a syndrome bit rate control module, wherein the MDVC encoder includes predictive video encoders and WZ encoders for video frames coming from digital cameras in each group; and
    one or more receivers coupled to the transmitter, wherein the transmitter forms multiple groups, including multiple captured video frames coming from associated multiple digital cameras, based on a predetermined criteria, wherein the transmitter declares video frames coming from a predetermined number of the multiple digital cameras in each group as key video frames, wherein the transmitter declares video frames coming from remaining multiple digital cameras in each group as non-key video frames, wherein the transmitter encodes the key video frames in each group to obtain associated encoded bits using predictive video encoder, wherein the transmitter encodes the non-key video frames in each group to obtain associated syndrome bits using WZ encoder, wherein the syndrome bit rate control module decodes the encoded key video frames in each group using associated predictive video decoders, to obtain associated decoded bits and decodes the encoded non-key video frames in each group using associated WZ decoders and the decoded key video frames with iteratively increasing number of syndrome bits, to obtain associated decoded bits and CRC bits, wherein the syndrome bit rate control module determines an optimal number of syndrome bits of video frames in each non-key video frame in each group to be sent to the one or more receivers based on a successful WZ decoding, and wherein the transmitter sends encoded bits of key video frames and the determined optimal number of syndrome bits of each non-key video frame in each group to the one or more receivers.

14. The system of claim 13, wherein, in determining the optimal number of syndrome bits, the syndrome bit rate control module is operable to iteratively increase the syndrome bits making hamming distance between syndrome bits and decoded bits to be substantially 0 and CRC of encoded bits and decoded bits to substantially match.

15. The system of claim 13, wherein each of the one or more receivers further comprises:
predictive video decoders;
WZ decoders coupled to the predictive video decoders; and
a video frames selector coupled to the predictive video decoders and the WZ decoders, wherein one of the one or more receivers decodes the encoded key video frames in a user selected group using associated predictive video decoders, wherein the one of the one or more receivers decodes the encoded non-key video frames in the user selected group using associated WZ decoders and the decoded key video frames with determined optimal number of syndrome bits by estimating non-key video frames using interpolation or extrapolation of the key video frames and performing error correction in the estimated non-key video frames using determined optimal number of syndrome bits in the user selected group by the receiver, and wherein the video frames selector chooses a user selected video frames in the user selected group, coming from an associated decoding, for viewing.

16. The system of claim 13, wherein the syndrome bit rate control module is further operable to:
select one of the formed groups, select the encoded key video frames among the selected group and select the syndrome bits of one of the non-key video frames from the selected group; and
decode the encoded key video frames in the selected group using a predictive video decoder, to obtain associated decoded bits and decode the selected encoded non-key video frames in the selected group using a WZ decoder and the decoded key video frames with iteratively increasing number of the syndrome bits, to obtain associated decoded bits and CRC bits.

17. The system of claim 13, wherein the syndrome bit rate control module is further operable to:

normalize the determined optimal number of syndrome bits of all the non-key video frames of all the groups, such that their sum does not exceed available transmission bandwidth by the transmitter.

18. The system of claim 13, wherein the syndrome bit rate control module is further operable to:
send encoded bits of key video frames and the normalized optimal number of syndrome bits of each non-key video frame of each group to the multiple receivers.

19. The system of claim 13, wherein the predetermined criteria comprises correlation between captured video frames based on substantially similar objects viewed by the multiple digital cameras and/or based on proximity of multiple digital cameras, coming from multiple digital cameras.

20. The system of claim 13, wherein the predictive video encoders are based on standard encoding techniques selected from the group consisting of advanced video coding (H.264), moving picture experts group (MPEG)2, video codec(VC)1 and codec developed by DivX, Inc. (DivX).

21. The system of claim 13, wherein syndrome bits comprises parity bits and CRC bits.

22. The system of claim 13, wherein the predetermined number is less than or equal to 2.

23. The system of claim 13, wherein in encoding the non-key video frames, the total number of syndrome bits depends on a frame resolution, a block size used for transform and/or quantization parameters.

24. The system of claim 13, wherein the WZ encoders are based on block based transform, quantization and/or rate adaptive channel encoding.

25. The system of claim 15, wherein the WZ decoders include a rate adaptive channel decoding, side information generation, inverse quantization and/or inverse transform.

26. A non-transitory computer-readable storage medium for multiview distributed video coding based on adaptive syndrome bit rate control, when executed by a computing device, cause the computing device to:
form multiple groups, including multiple captured video frames coming from associated multiple digital cameras, based on a predetermined criteria by a transmitter;
declare video frames coming from a predetermined number of the multiple digital cameras in each group as key video frames by the transmitter;
declare video frames coming from remaining multiple digital cameras in each group as non-key video frames by the transmitter;
encode the key video frames in each group to obtain associated encoded bits using predictive video encoding by the transmitter;
encode the non-key video frames in each group to obtain associated syndrome bits using Wyner-Ziv (WZ) encoding by the transmitter, wherein the syndrome bits include parity bits and cyclic redundancy check (CRC) bits;
decode the encoded key video frames in each group using predictive video decoding, to obtain associated decoded bits and decode the encoded non-key video frames in each group using WZ decoding and the decoded key video frames with iteratively increasing number of syndrome bits, to obtain associated decoded bits and the CRC bits by the transmitter;
determine an optimal number of syndrome bits of video frames in each non-key video frame in each group to be sent to receivers based on a successful WZ decoding by the transmitter; and send encoded bits of key video frames and determined optimal number of syndrome bits of each non-key video frame in each group by the transmitter to multiple receivers.

27. The non-transitory computer-readable storage medium of claim 26, wherein the successful WZ decoding comprises an iteration at which increasing the syndrome bits makes hamming distance between syndrome bits and decoded bits to be substantially 0 and CRC of encoded bits and decoded bits to substantially match.

28. The non-transitory computer-readable storage medium of claim 26, further comprising:
   decoding the encoded key video frames in a user selected group using predictive video decoding by the receiver;
   decoding the encoded non-key video frames in the user selected group using WZ decoding and the decoded key video frames with the determined optimal number of syndrome bits comprises estimating non-key video frames using interpolation or extrapolation of the key video frames and performing error correction in the estimated non-key video frames using the determined optimal number of syndrome bits in the user selected group by the receiver; and
   choosing a user selected video frames in the user selected group, coming from an associated decoding, for viewing.

* * * * *